(12) United States Patent
Hughes et al.

(10) Patent No.: US 6,409,241 B1
(45) Date of Patent: Jun. 25, 2002

(54) APPARATUS FOR GRIPPING CERAMIC SUBSTRATES

(75) Inventors: Richard P. Hughes, Kanata; Paul S. Ertl; Keith D. Anderson, both of Nepean, all of (CA)

(73) Assignee: Nortel Networks Limited, St. Laurent (CA)

( * ) Notice: Subject to any disclaimer, the term of this patent is extended or adjusted under 35 U.S.C. 154(b) by 31 days.

(21) Appl. No.: 09/660,542

(22) Filed: Sep. 12, 2000

(51) Int. Cl.[7] .............................................. B25J 15/12
(52) U.S. Cl. ..................... 294/99.1; 294/119.1; 294/902
(58) Field of Search ............................... 294/1.1, 2, 16, 294/27.1, 28, 33, 86.4, 99.1, 99.2, 100, 103.1, 104, 106, 902; 29/739, 740, 759; 269/268, 270, 286; 414/941; 901/31, 36, 39

(56) References Cited

U.S. PATENT DOCUMENTS

| | | | |
|---|---|---|---|
| 3,273,933 A | * 9/1966 | Jochim | 294/902 X |
| 4,610,475 A | 9/1986 | Heiserman | 294/86.4 |
| 4,717,190 A | * 1/1988 | Witherspoon | 294/902 X |
| 5,207,465 A | * 5/1993 | Rich | 294/2 |
| 5,520,501 A | * 5/1996 | Kouno et al. | 294/119.1 X |
| 5,538,305 A | * 7/1996 | Conway et al. | 294/99.1 X |
| 5,711,647 A | 1/1998 | Slocum | 414/749 |
| 6,216,883 B1 | * 4/2001 | Kobayashi et al. | 414/941 X |
| 6,279,889 B1 | * 8/2001 | Tikhonov | 269/268 |

* cited by examiner

Primary Examiner—Johnny D. Cherry

(57) ABSTRACT

An apparatus is disclosed for the aligning of ceramic carrier substrates on base substrates. The apparatus is a gripper having angled faces lined with soft metallic pads embedded with diamonds that engage in a vertical direction with microfeatures in the ceramic carrier of a semiconductor, providing a secure grip throughout alignment and bonding to a base substrate and providing a gentle release upon disengagement. The gripper is typically detachably affixed to a micromanipulator to provide controlled motion and is spring mounted to provide self adjustment to variations in ceramic carrier substrate thickness and angle.

18 Claims, 4 Drawing Sheets

APPARATUS FOR GRIPPING CERAMIC SUBSTRATES

FIELD OF THE INVENTION

The present invention relates to the alignment of a semiconductor on a ceramic carrier to a base substrate, and more specifically to an apparatus that securely grips a semiconductor on a ceramic carrier being bonded to a ceramic base substrate.

BACKGROUND OF THE INVENTION

The process of manufacturing semiconductors is well established and involves several stages, one of which is a bonding process. The bonding process involves the submicron alignment of a semiconductor ceramic carrier on a ceramic substrate. The submicron alignment of the ceramic components can be accomplished with relative case employing micromanipulator stages to provide controlled motion; however at present, difficulties lie with the ability to fix and then release these ceramic components without causing a shift in positioning.

These devices must be rigidly held in place for the duration of the bonding process to prevent misalignment due to shrinkage of the adhesive used to bond the carrier to the substrate. The gripping device therefore must be robust enough to apply sufficient force so as to overcome any adhesive shrinkage forces.

Robust high force grippers, typically in the form of mechanical jaws such as pliers or tweezers, that can provide the necessary high gripping force, often cannot be disengaged without transferring some of the disengagement force to the carrier resulting in unwanted movement.

Gentle disengagement grippers, typically in the form of a vacuum inducing gripping apparatus such as suction cups, that can minimize unwanted movement during disengagement provide a relatively low gripping force.

For the foregoing reasons, there is a need for a rigid non-slip gripper that also providers a gentle release.

SUMMARY OF THE INVENTION

The present invention is directed to a gripping apparatus that satisfies this need. The apparatus is a microgripper comprised of at least two grippers having angled gripping faces lined with an abrasive material. The grippers are configured in opposing pairs above the horizontal plane with the top edges of their angled gripping faces oriented closest to each other and the bottom edges oriented furthest from each other. The grippers are separated to the width required to engage the upper edges of a carrier substrate between the top and bottom edges of the angled gripping faces whereby a grip is provided, maintaining consistent contact between the carrier substrate and the base substrate.

In one aspect of the present invention the grippers are spring mounted to transfer by deflection of the springs, the desired downward force. The spring mounting comprises a plurality of parallel pairs of cantilevered flat springs attached to a support structure forming a gripper assembly. The parallel spring pairs are separated by spacers thereby maintaining the gripper assembly in a parallelogram configuration so as to allow the grippers to move vertically while remaining parallel with the support structure and providing self-adjustment to variations in carrier substrate thickness and angle.

In another aspect of the present invention the abrasive lining of the grippers consist of a soft pad with an embedded crystalline material, typically diamonds. In a related aspect, the grippers have a small triangular protrusion left on the angled gripping face to aid in positioning these abrasive pads.

The practical range of the angle of the gripping faces is from about 30° to about 60°, through an angle of about 50° is preferred for semiconductor on ceramic substrates.

The gripper assembly is typically detachably affixed to a micromanipulator to provide controlled motion through X, Y, Z and rotation axes to facilitate alignment by translation and rotation of the carrier substrate on the upper surface of the base substrate.

Once the bonding process has been completed, the grippers are disengaged vertically by raising the gripper assembly through the Z axis utilizing the micromanipulator stages, following the same path as engagement but in the opposite direction thereby providing a gentle release.

This apparatus requires a lower skilled operator, a shorter training period, and produces a reduction in alignment time. All of these factors result in significant cost savings.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PRESENTLY PREFERRED EMBODIMENT

Figure 1:
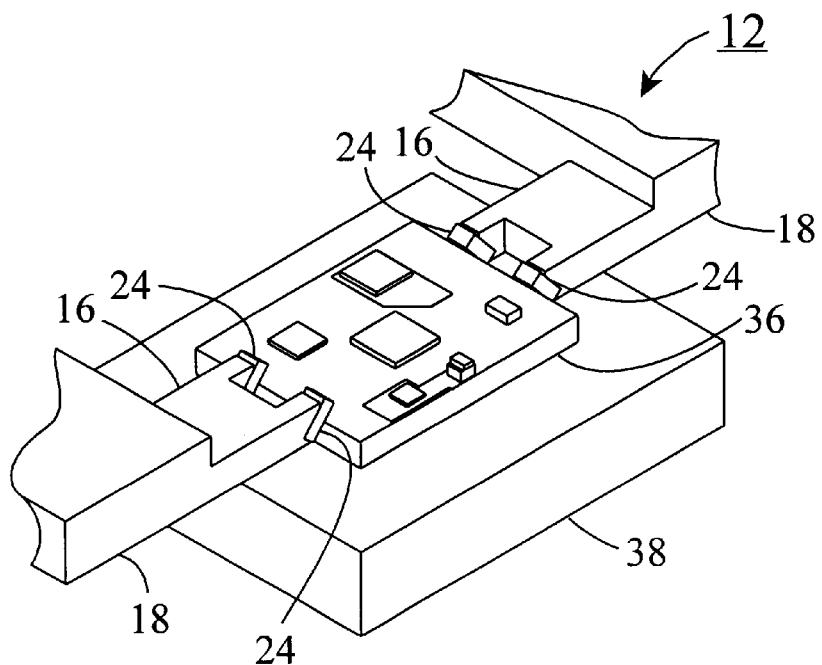
FIG. 1 is a perspective view of the grippers engagement with the carrier and base substrate assembly.

As shown in FIG. 1, the apparatus for gripping ceramic substrates comprises a gripper assembly 12 with at least two holders 18, each having one or more angled faces 20 angled to the horizontal plane. The angled faces 20 have a top edge and a bottom edge and are lined with an abrasive material to form a gripper 16. These grippers 16 are configured in pairs wherein their angled faces 20 are opposing one another above the horizontal plane, the top edges of the angled faces 20 being oriented closest to each other and the bottom edges being oriented furthest from each other. The grippers 16 are adapted to being separated to a width required to engage the upper edges of a carrier substrate 36 being aligned on a base substrate 38, between the top and bottom edges of the angled gripping faces 20, whereby a grip is provided maintaining consistent contact between the carrier substrate 36 and the base substrate 38.

Figure 7:
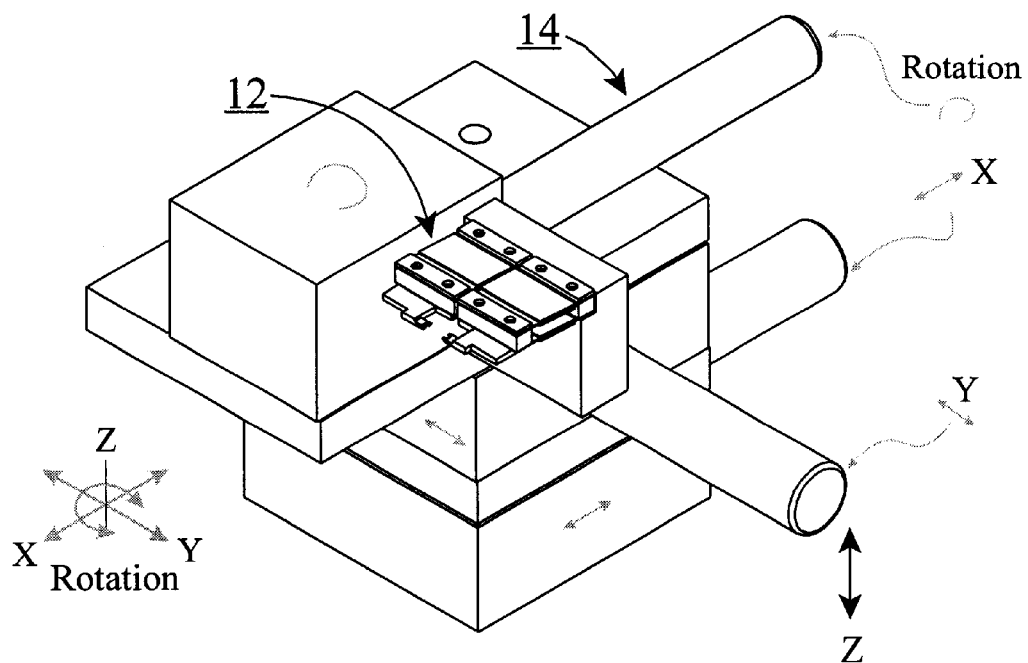
FIG. 7 is a perspective view of the gripper assembly in a typical application mounted to a 3 axis micromanipulator stage.

As shown in FIG. 7, the apparatus for aligning ceramic substrates comprises a gripper assembly 12 and a micromanipulator 14 for providing controlled motion of the gripper assembly 12 through X, Y, Z, and rotation axes. The X, Y and rotation axes motions provided by the micromanipulator facilitate alignment by translation and rotation of the carrier substrate 36 on the upper surface of the base structure 38. Once the bonding process has been completed, the grippers 16 are disengaged vertically by raising the gripper assembly 12 through the Z axis utilizing the micromanipulator 14.

Figure 2:
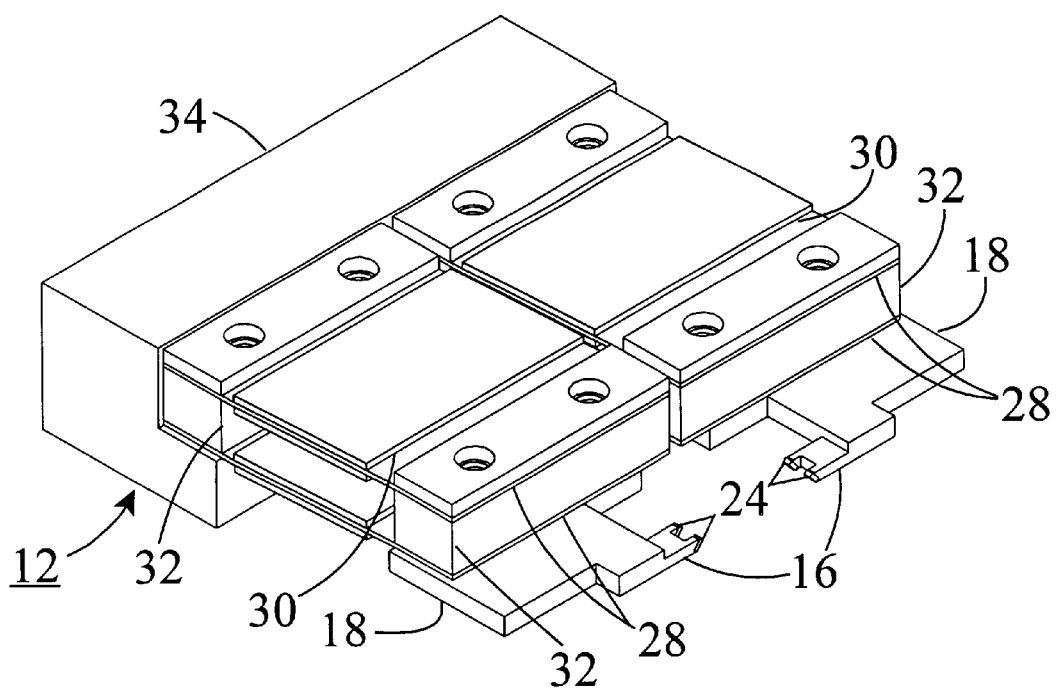
FIG. 2 is a perspective view of the gripper assembly.
Figure 3:
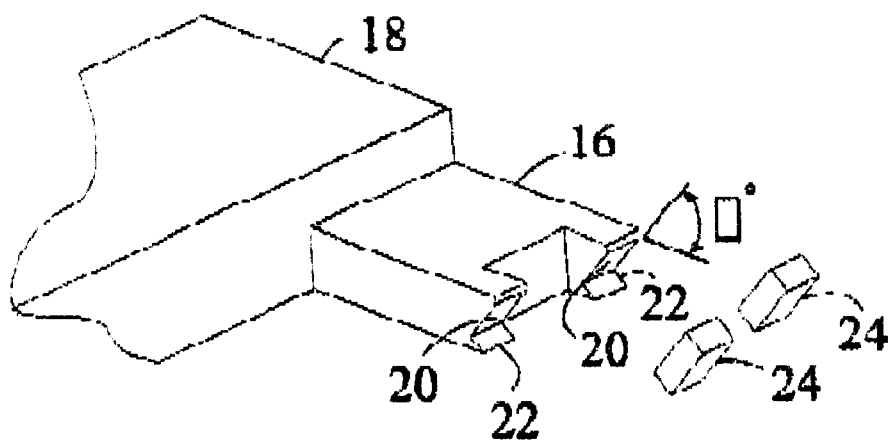
FIG. 3 is a perspective view of the detail of the grippers.

In a preferred embodiment as shown in FIG. 2, the gripper assembly 12 includes at least two grippers 16 set assembled in opposing pairs, a gripper 16 comprising a holder 18 with, as shown in FIG. 3, angled faces 20. The angled faces 20 are lined with soft metallic pads 24 embedded with a crystalline material, typically diamonds. The pads 24 can be aided in location by small triangular protrusions 22 on the angled faces.

Figure 4:
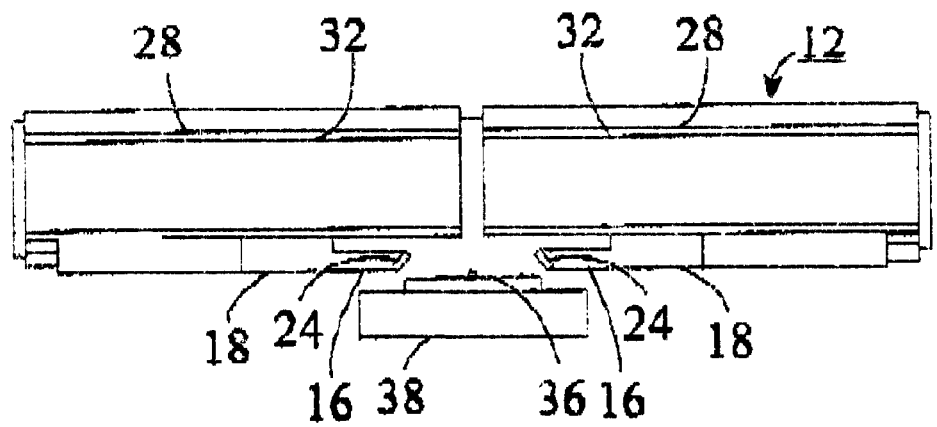
FIG. 4 is a front elevation view of the gripper assembly in typical alignment above the carrier and base substrate assembly.

As shown in FIGS. 2 and 4, the opposing gripper 16 pairs are spring mounted to parallel pairs of stiffened cantilevered flat springs 28 comprising wide cantilevered flat spring 28 that have been stiffened with aluminum plates 30. The stiffened parallel spring 28 pairs are separated by two spaces 32 and at least two stiffened parallel spring 28 pairs are mounted to a support structure 34 thereby maintaining the gripper assembly 12 in a parallelogram configuration allowing the grippers 16 to move vertically while remaining parallel with the support structure 34 and providing self adjustment to variations in carrier substrate 36 thickness and angle.

Figure 5:
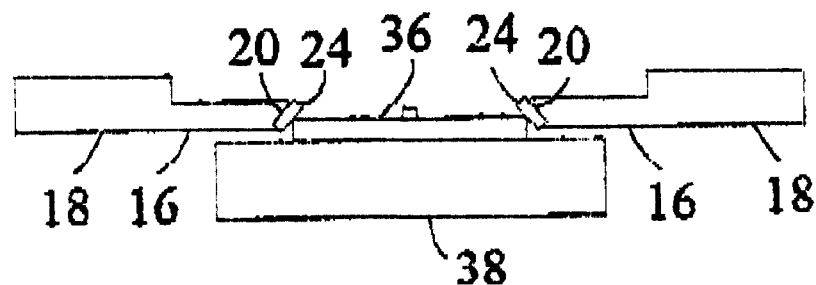
FIG. 5 is a front elevation view of the grippers' engagement with the carrier and base substrate assembly.

As shown in FIG. 5, these grippers 16 must be rigidly held in place for the duration of the bonding process to prevent misalignment due to shrinkage of the adhesive used to bond the carrier substrate 36 to the base substrate 38. The gripping device must therefore be robust enough to apply sufficient force so as to overcome any adhesive shrinkage forces. The gripper 16 is typically constructed of nickel plated stainless steel or brass to allow for soldering.

Figure 8:
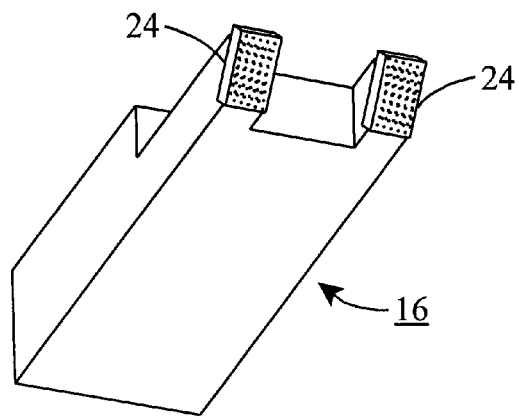
FIG. 8 is a perspective view of the gripper detailing the diamond embedded pads.

As shown in FIG. 3, the cantilevered end of the gripper 16 has a plurality of angled faces 20, each face being milled at a predetermined angle θ to the horizontal plane leaving a small triangle protrusion 22. The number of angled faces 20 may be varied as required. The angled faces 20 are lined with pads 24 made of brass or silver/copper alloy and have many diamonds embedded throughout, as shown in FIG. 8. These pads 24 measure approximately 1.0×0.5×0.25 mm. The pads 24 are soldered to the angled faces 20 using a soften electronic type solder, the small triangular protrusions 22 aiding in the location of the pads 24 on the angled faces 20.

As shown in FIG. 5, the grippers 16 are configured in pairs with their angled faces 20 facing opposite one another above the horizontal plane, the top edges of the angled faces 20 being oriented closest to each other and the bottom edges of the angled faces 20 being oriented furthest from each other. The grippers 16 are separated to a width wherein their lined angled faces 20 engage, between their top and bottom edges, the upper edges of a carrier substrate 36 being aligned on a base substrate 38. The choice of the angle of the faces will be dependent upon alignment requirements. If a large normal force is required with lower coplanar alignment forces, the angle may be reduced. Increasing the angle will allow for greater alignment forces at a reduced normal force. However, too small an angle will lead to slippage while too great an angle will cause the carrier substrate 36 to bind in the grippers 16 resulting in a harsh release. It is estimated that the practical range of the angle θ is from about 30° to about 60°, though an angle of about 50° is preferred for semiconductors on ceramic substrates.

Figure 6:
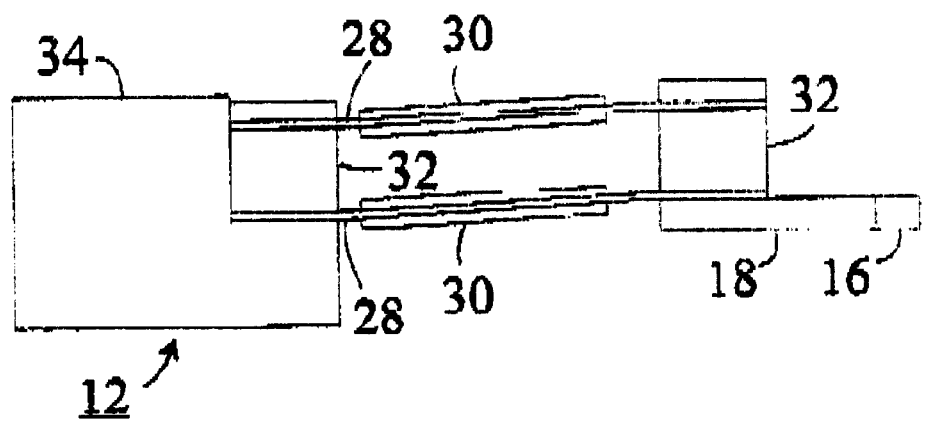
FIG. 6 is a side elevation view of the gripper assembly.

As shown in FIGS. 2, 4 and 6, the grippers 16 are spring mounted to transfer by deflection of the springs the desired downward force. The spring mounting comprises a plurality of parallel pairs of cantilevered flat springs 28 attached to a support structure 34 forming a gripper assembly 12. The flat springs 28 are made of beryllium copper and are stiffened with aluminum plates 30 which limit the flexing to the area at the end of the plates. The springs 28 are very wide and therefore do not allow any horizontal movement of the grippers 16. Spacers 32 keep the spring 28 parallel, maintaining the gripper assembly 12 in a parallelogram configuration during deflection, thereby allowing the grippers 16 to move vertically while remaining parallel with the support structure 34 and providing self adjustment to variations in carrier substrate 36 thickness and angle. In this configuration, the grippers 16 provide a secure grip facilitating alignment and maintaining consistent contact between the carrier substrate 36 and the base substrate 38 during the bonding process.

For small vertical translations of the grippers 16, the horizontal displacement is very small. The stiffer the spring, the smaller the vertical displacement required for a given force. In order to minimize horizontal displacement, one chooses a stiff spring with a length much greater than the thickness of the spacers. A pair of grippers 16 is set assembled opposite one another. As shown in FIG. 4, engagement is achieved by aligning the gripper assembly 12 above the carrier substrate 36 and then either lowering the gripper assembly 12 or raising the carrier substrate 36 and base substrate 38 assembly until the desired normal force through spring deflection is achieved. The angled pads 24 and the independent stiffened parallel spring 28 pairs self-adjust to variations in carrier substrate 36 thickness and angle. As shown in FIG. 1, the pads 24 engage the top edges of the carrier substrate 36 and the hard, sharp edges of the diamonds lock into the microfeatures of the ceramic edge. As shown in FIG. 7, the gripper assembly 12 is typically detachably affixed to a micromanipulator 14, providing controlled motion through X, Y, Z and rotation axes to facilitate alignment by translation and rotation of the carrier substrate 36 on the upper surface of the base substrate 38.

Once the bonding process has been completed, the grippers 16 are disengaged vertically by raising the gripper assembly 12 utilizing the micromanipulator 14, thereby following the same path as engagement but in the opposite direction. The engagement of the diamonds with the ceramic edge consists of microfeatures interlocked in a vertical direction. In having the diamonds disengage vertically from the vertical microfeatures in the ceramic carrier substrate's 36 edges, little or no force is transmitted to the carrier substrate 36, thereby providing a gentle release.

The previously described versions of the present invention have many advantages, including providing for both a rigid non-slip grip and a gentle release. This apparatus is useful for many configurations of chip on carrier alignment, other than substrate on substrate alignment, specifically when a device on a carrier must be micromanipulated upon a planar substrate. This apparatus requires a lower skilled operator, a shorter training period, and produces a reduction in alignment time. All of these factors result in significant cost savings.

Although the present invention has been described in considerable detail with reference to certain preferred versions thereof, other versions are possible. Therefore, the spirit and scope of the appended claims should not be limited to the description of the preferred versions contained herein.

All the features disclosed in this specification (including any accompanying claims, abstracts, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A microgripper for aligning a carrier substrate on a base substrate, the microgripper comprising:
   (i) a plurality of holders each having one or more faces angled to the horizontal plane, each of said faces having a top edge and a bottom edge;
   (ii) an abrasive lining covering said angled faces to form a gripper; and
   (iii) a pair of said grippers being configured wherein their angled faces are opposing one another above the horizontal plane, the top edges of said angled face being oriented closest to each other and the bottom edges of said angled faces being oriented furthest from each other, said grippers adapted to being separated to a width required to engage upper edges of a carrier substrate between the top and bottom edges of said angled faces whereby a grip is provided, maintaining consistent contact between said carrier substrate and a base substrate.

2. The microgripper according to claim 1, wherein said grippers are spring mounted to transfer by deflection of said springs a desired downward force.

3. The microgripper according to claim 2, wherein the spring mounting comprises:
   (i) one or more flat spring pairs wherein each of said spring pairs comprises a top spring and a bottom spring, each of said springs having a cantilevered end and a fixed end;
   (ii) a plurality of spacers separating said top spring from said bottom spring of said spring pairs whereby said top spring said bottom spring remain parallel to each other;
   (iii) each of said spring pairs' cantilevered ends being mounted with one or more of said grippers; and
   (iv) a support structure having affixed one or more of said gripper-mounted spring pairs at said spring pairs' fixed ends thereby forming a gripper assembly whereby said gripper assembly maintains a parallelogram configuration permitting said grippers to move vertically while remaining parallel with said support structure, and provides self adjustment to variations in thickness and angle of said carrier substrate.

4. The microgripper according to claim 3, wherein at least one stiffening plate is attached to each of said springs whereby said springs are stiffened to limit deflection of said springs to areas beyond the ends of said stiffening plates.

5. The microgripper according to claim 1, wherein said abrasive lining comprises:
   (i) a soft pad; and
   (ii) crystalline material embedded in said soft pad to form an abrasive pad.

6. The microgripper according to claim 5, wherein said crystalline material is diamonds.

7. The microgripper according to claim 1, wherein said angled face has an angle between about 30° and about 60°.

8. The microgripper according to claim 1, wherein said angled face has an angle of about 50°.

9. The microgripper according to claim 1, wherein a small triangular protrusion is left on said angled face to aid in positioning said abrasive linings.

10. An apparatus comprising:
    (i) a micromanipulator; and
    (ii) a microgripper for aligning a carrier substrate on a base substrate, the microgripper comprising:
        (a) a plurality of holders each having one or more faces angled to the horizontal plane, each of said faces having a top edge and bottom edge;
        (b) an abrasive lining covering said angled faces to form a gripper; and
        (c) a pair of said grippers being configured wherein their angled faces are opposing one another above the horizontal plane, the top edges of said angled faces being oriented closest to each other and the bottom edges of said angled faces being oriented furthest from each other, said grippers adapted to being separated to a width required to engage upper edges of a carrier substrate between the top and bottom edges of said angled faces whereby a grip is provided, maintaining consistent contact between said carrier substrate and a base substrate.

11. The microgripper according to claim 10, wherein said grippers are spring mounted to transfer by deflection of said spring a desired downward force.

12. The microgripper according to claim 11, wherein the spring mounting comprises:
    (i) one or more flat spring pairs wherein each of said spring pairs comprises a top spring and a bottom spring, each of said springs having a cantilevered end and a fixed end;
    (ii) a plurality of spacers separating said top spring from said bottom spring of said spring pairs whereby said top spring and said bottom spring remain parallel to each other;
    (iii) each of said spring pairs' cantilevered ends being mounted with one or more of said grippers; and
    (iv) a support structure having affixed one or more of said gripper-mounted spring pairs at said spring pairs' fixed ends thereby forming a gripper assembly whereby said gripper assembly maintains a parallelogram configuration permitting said grippers to move vertically while remaining parallel with said support structure, and provides self adjustment to variations in thickness and angle of said carrier substrate.

13. The microgripper according to claim 12, wherein at least one stiffening plate is attached to each of said springs whereby said springs are stiffened to limit deflection of said springs to areas beyond the ends of said stiffening plates.

14. The microgripper according to claim 10, wherein said abrasive lining comprises:
    (i) soft pad; and
    (ii) crystalline material embedded in said soft pad to form an abrasive pad.

15. The microgripper according to claim 14, wherein said crystalline material is diamonds.

16. The microgripper according to claim 10, wherein said angled face has an angle between about 30° and about 60°.

17. The microgripper according to claim 10, wherein said angled face has an angle of about 50°.

18. The microgripper according to claim 10, wherein a small triangular protrusion is left on said angled face to aid in positioning and abrasive linings.

* * * * *